United States Patent [19]

Arimoto et al.

[11] Patent Number: 4,811,348
[45] Date of Patent: Mar. 7, 1989

[54] SEMICONDUCTOR LASER ARRAY DEVICE

[75] Inventors: Akira Arimoto, Kodaira; Masahiro Ojima, Tokyo; Susumu Saito, Hachiouji, all of Japan

[73] Assignee: Hitachi, Ltd., Tokyo, Japan

[21] Appl. No.: 153,772

[22] Filed: Feb. 8, 1988

[30] Foreign Application Priority Data

Feb. 13, 1987 [JP] Japan ................................. 62-29646

[51] Int. Cl.⁴ ............................................. H01S 3/13
[52] U.S. Cl. ...................................... 372/29; 372/38; 372/33
[58] Field of Search ................... 372/75, 9, 26, 29, 33; 372/43, 38

[56] References Cited

U.S. PATENT DOCUMENTS

| 4,359,773 | 11/1982 | Swartz et al. | 372/26 |
| 4,444,970 | 8/1984 | Loka et al. | 372/26 |
| 4,479,221 | 10/1984 | Kitamura | 372/75 |
| 4,575,854 | 3/1986 | Martin | 372/75 |
| 4,592,057 | 5/1986 | Comerford | 372/26 |
| 4,635,246 | 1/1987 | Taylor et al. | 372/18 |

Primary Examiner—Léon Scott, Jr.
Attorney, Agent, or Firm—Antonelli, Terry & Wands

[57] ABSTRACT

A semiconductor laser array device in which a single photodetector is provided near the exit ports on one side of the semiconductor laser array device that has a plurality of semiconductor lasers arranged close to each other, the light outputs from each of the laser light sources are detected in a time-sharing manner, and the corresponding lasers are controlled by feedback relying upon the detected signals, so that outputs of the lasers are stabilized.

8 Claims, 5 Drawing Sheets

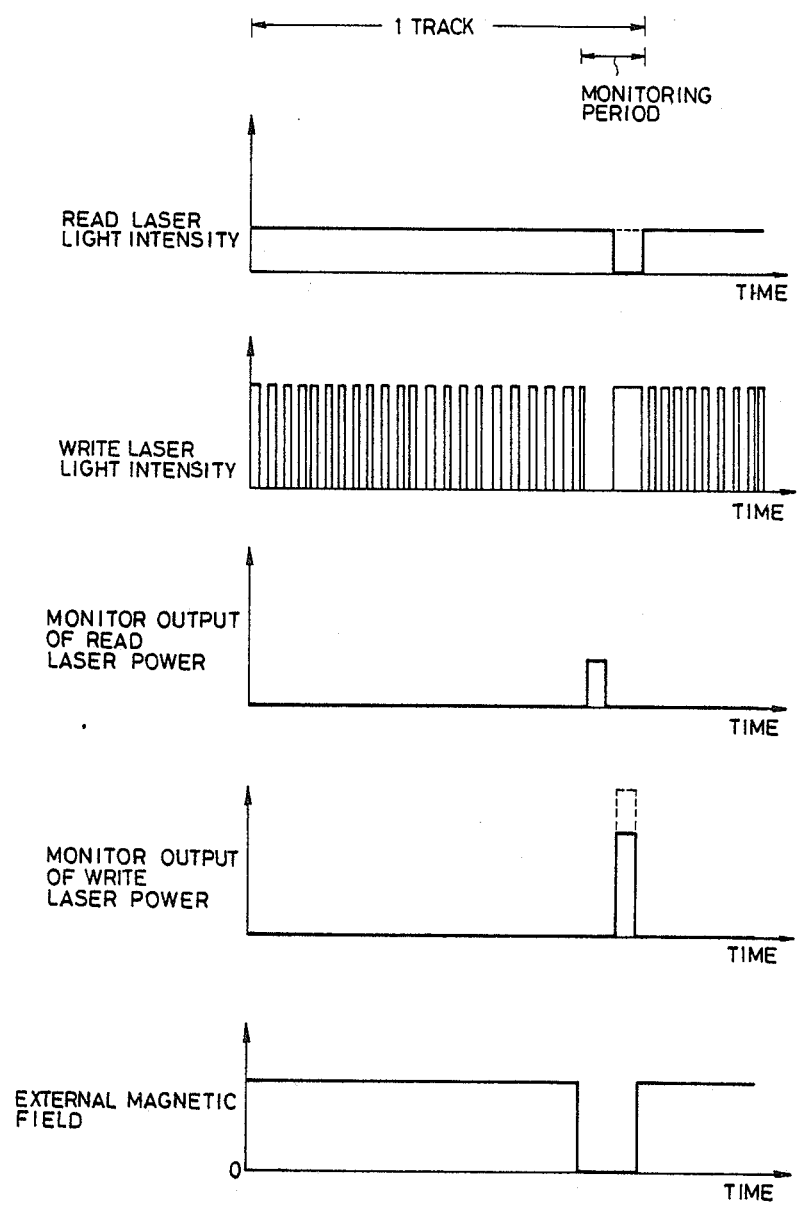

SEMICONDUCTOR LASER ARRAY DEVICE

BACKGROUND OF THE INVENTION

The present invention relates to a semiconductor laser array device in which a plurality of semiconductor lasers are arranged in the form of a one-dimensional or two-dimensional array.

Owing to its advantages such as small size, small power consumption and direct modulation, a semiconductor laser has now been extensively employed in such devices as compact discs, video discs and laser printers to substitute for the gas laser. Up to the present time, the semiconductor laser light source is usually used in a number of one in these devices. It can, however, be contrived to use the semiconductor lasers in a plural number as the devices become highly sophisticated and more functional. It has now been urged to provide a semiconductor laser array in which a plurality of semiconductor lasers are arranged in a single package. An example can be found in J. N. Walpole et al., Conference on Laser and Electrooptics, Technical Digest, 1986, pp. 64–65, TUB 2, "Monolithic 2-D Arrays of High-Power GaInAsP/InP Surface-Emitting Lasers".

Among many characteristics, the semiconductor laser has a characteristic in that a change in the temperature causes the laser output to change despite the same current is permitted to flow into the laser. In the above-mentioned optical disc devices and laser printers, in general, the output on one side of the semiconductor laser is detected by a photodetector installed in the vicinity thereof and the electric current is adjusted by feedback control operation so that the detected output becomes constant at all times as disclosed in, for example, Japanese Patent Publication No. 46879/1983.

Even a plurality of semiconductor laser arrays require a feedback control operation to maintain the light outputs at predetermined values. In the semiconductor laser array, however, the individual lasers are arranged at positions maintaining a distance of smaller than 1 mm relative to each other. Furthermore, the laser lights emitted from the semiconductor lasers diverge at a large angle of expansion.

It is therefore difficult to detect light outputs from the individual semiconductor lasers using individual photodetectors.

SUMMARY OF THE INVENTION

The object of the present invention is to provide a semiconductor laser array device which enables the outputs of the individual semiconductor lasers to be stabilized.

In order to achieve the above-mentioned object according to the present invention, each of the light outputs is detected in time sequence and the feedback control operation is carried out.

That is, the present invention deals with a semiconductor laser array device in which a plurality of semiconductor lasers are one-dimensionally or two-dimensionally arranged being close to each other, wherein a single photodetector is provided near exit ports on one side of a plurality of laser light sources to detect light outputs from said plurality of laser light sources, the light outputs of all laser light sources whose outputs must be stabilized are independently detected in a time-sharing manner using said photodetector within predetermined periods of time, and the laser array is controlled by feedback relying upon the detected outputs so that the individual laser light outputs that must be stabilized are maintained at predetermined constant values until the next time of detection.

BRIEF DESCRIPTION OF THE DRAWINGS

FIG. 7 is a time chart illustrating a relationship between the change of the laser light intensity with the lapse of time and the change of the monitor output with the lapse of time of the semiconductor laser array device according to another embodiment of the present invention.

DETAILED DESCRIPTION OF THE INVENTION

Figure 1:
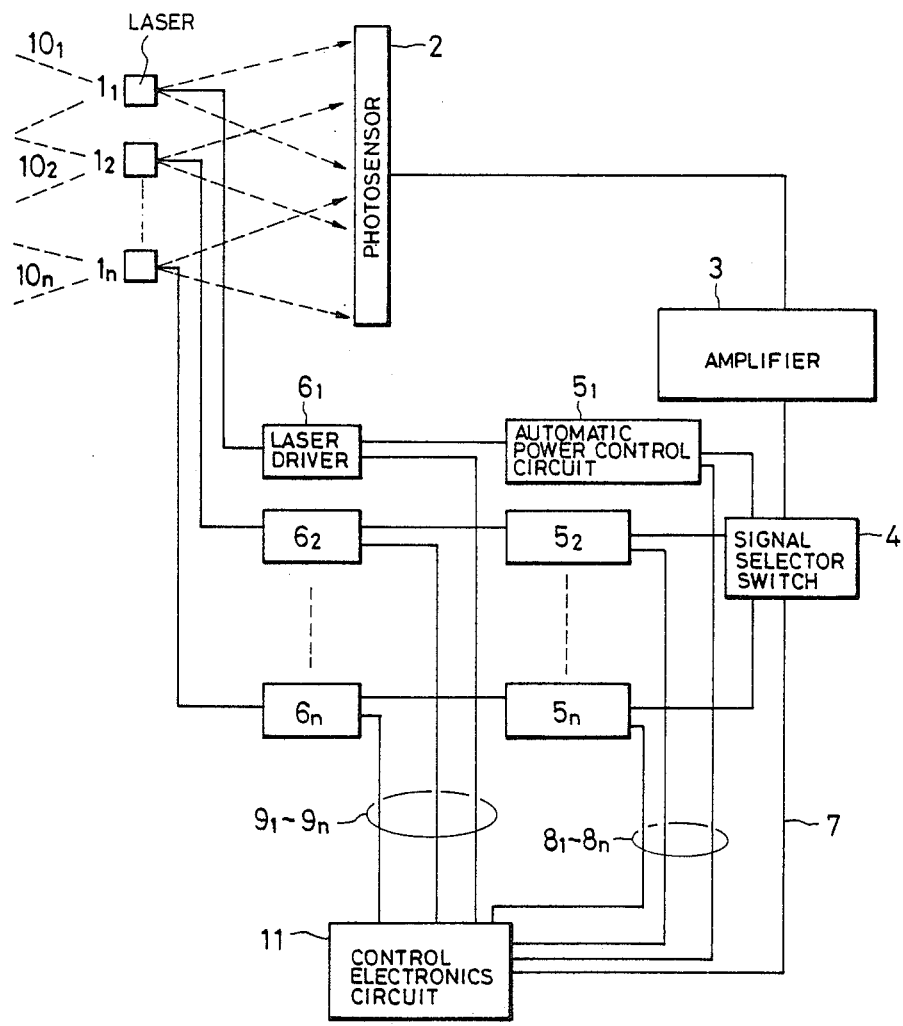
FIG. 1 is a block diagram illustrating a semiconductor laser array device according to the present invention.
Figure 2:
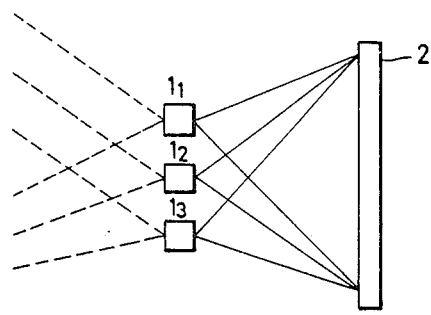
FIG. 2 is a diagram which schematically illustrates the semiconductor laser array.
Figure 3:
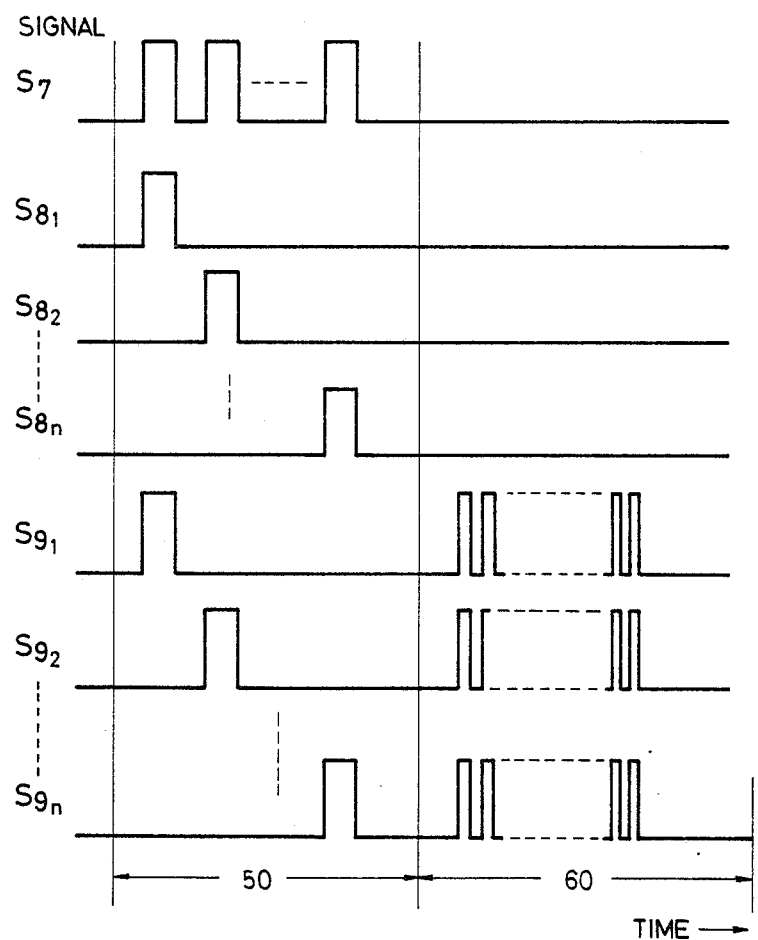
FIG. 3 is a time chart of signals for controlling the semiconductor laser array device according to an embodiment of the present invention.

FIG. 2 illustrates a semiconductor laser array device which consists of three lasers $1_1$ to $1_3$. The outputs from the lasers are monitored by a photodetector 2. The lasers $1_1$ to $1_3$ are usually close to each other maintaining a distance of about 100 μm to 1 mm, and the exit angle of the laser beam is as broad as from 10° to 40° so that the photodetector 2 receives the light from all of the lasers. It is therefore impossible to spatially discriminate the outputs of the individual lasers. According to the present invention, the laser beams are detected in a time-sharing manner using a single detector. FIG. 1 is a diagram which illustrates the fundamental structure of the present invention, and FIG. 3 illustrates a control method of stabilizing the laser light outputs using the above structure. The laser outputs from n lasers $1_1$ to $1_n$ are all incident upon the single monitor photodetector 2. Reference numerals $10_1$ to $10_n$ denote laser beams that are emitted from the opposite side and that enter into a data processor (such as an optical disc or a laser printer). Each of the optical outputs must be stabilized. For this purpose, a special time is provided to detect and maintain constant the light outputs in addition to the time in which the lights $10_1$ to $10_n$ are effectively utilized, the lights $10_1$ to $10_n$ being emitted from the opposite side and being incident on the data processor.

According to Japanese Patent Laid-Open No. 19252/1984, there is disclosed a laser printer employing a semiconductor laser array, wherein the lasers are turned on sequentially but only one laser at one time during the non-printing period after each optical scanning, the light is detected by a monitor photodetector disposed at the back, and the light output is stabilized through a feedback control circuit. According to the above invention, however, the light output of only one laser is controlled in the scanning of one time, to decrease the stability in the control operation. In the case of a semiconductor laser array using ten semiconductor lasers, for example, the laser beam control of the next time is not effected until the optical scanning is effected 10 times for one particular laser.

The present invention is to control all of the plurality of lasers in every time of when the optical output is detected.

This can be adapted not only to the laser printer but also to the optical disc to carry out the similar optical control as will be described later in conjunction with the embodiments.

In FIG. 1, reference numeral 2 denotes a photodetector, 3 denotes an amplifier for amplifying the output of the photodetector, 4 denotes a signal selector switch, $5_1$ to $5_n$ denote APC (automatic power control) circuits that include a sample holding circuit and that maintain the light output constant, $6_1$ to $6_n$ denote laser drivers, and reference numeral 11 denotes a CE (control electronics) circuit for controlling the whole device.

Reference numerals 7, $8_1$ to $8_n$, and $9_1$ to $9_n$ denote signal lines for controlling the signal selector switch 4, APC circuits $5_1$ to $5_n$, and laser drivers $6_1$ to $6_n$.

FIG. 3 illustrates signals for controlling the device, and wherein the abscissa represents the time, and symbols $S_{81}, \ldots, S_{8n}$ and $S_{91}, \ldots, S_{9n}$ denote signals of the signal lines 7, $8_1$ to $8_n$ and $9_1$ to $9_n$ of FIG. 1. Symbol $S_7$ denotes a signal for driving a switch that delivers a light detect signal to the APC circuits to generate n drive signals within a predetermined light detect time. The light detect time is not included in a data signal time 60.

Figure 4:
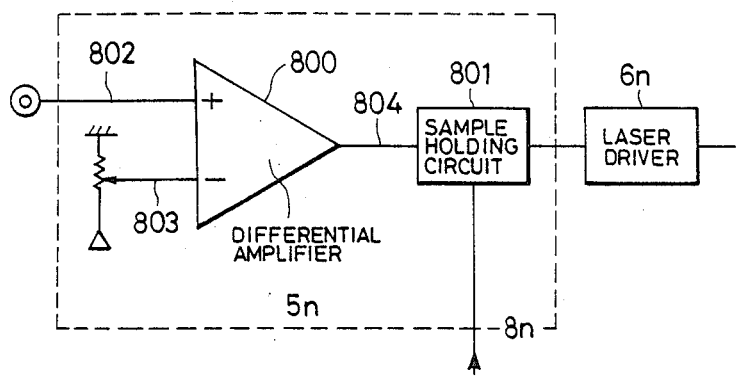
FIG. 4 is a diagram illustrating an automatic power control (APC) circuit which has a sample-holding function and which maintains the light output constant in the semiconductor laser array device of the present invention.

Signals $S_{81}$ to $S_{8n}$ are then applied to the APC circuits $5_1$ to $5_n$. To the n-th APC circuit $5n$ is applied a signal which is in synchronism with the n-th signal of $S_7$. At this time only, the APC circuit $5n$ operates to detect the signal, to correct a predetermined value and to hold the value. FIG. 4 illustrates an APC circuit 5 having a sample holding function. A light output signal 802 from the photodetector 2 enters into the APC circuit $5n$ through the signal selector switch 4 of FIG. 1. Reference numeral 803 denotes a circuit portion which sets a predetermined reference value to stabilize the laser output. A differential signal that has passed through a differential amplifier 800 enters into a sample holding circuit 801. The timing of sample holding is specified by a signal $S_{8n}$ that has passed through $8n$. An error signal is sampled and detected during the ON time of signal $S_{8n}$, and its value is held in the next time (data signal time 60 of FIG. 3). The laser driver $6n$ controls the laser output so that the error signal 804 becomes zero. Symbols $S_{91}$ to $S_{9n}$ denote signals for turning the signals on. In FIG. 3, the signals within the range 50 are so set as will not be superposed upon each other in time. The time 60 contains laser beam signals that will be used in the device. In the case of the laser printer, for example, they may be the signals for writing a pattern onto a photosensitive drum and in the case of the optical disc, they may be the signals to be written onto the disc or the signals for reading the data therefrom. As described above, the light outputs of the lasers are controlled in time sequence to stably operate the laser array.

DESCRIPTION OF THE PREFERRED EMBODIMENTS

Figure 5:
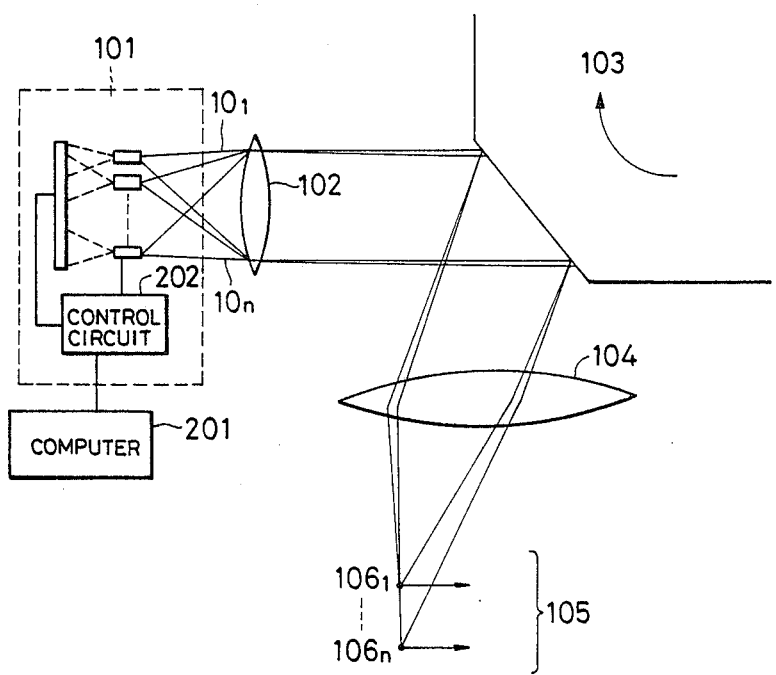
FIG. 5 is a diagram which schematically illustrates a laser printer that incorporates the semiconductor laser array device of the present invention.

Embodiment 1:

FIG. 5 illustrates an embodiment in which a semiconductor laser array device is employed in a laser printer that uses a plurality of beams. The laser lights $10_1$ to $10_n$ emitted from a semiconductor laser array device 101 reach a light scanning surface 105 passing through a collimator lens 102, a rotary polygonal mirror 103 and a focusing lens 104.

Use of a plurality of beams makes it possible to decrease the rotational speed of the rotary polygonal mirror and to decrease the laser outputs to a value that is divided by the number of lasers used. It was mentioned already that one of the problems associated with the use of a laser array was to stabilize the outputs of the individual lasers. To maintain the light output constant, in general, one photodetector is provided for one laser and the APC (automatic power control) is carried out to control the output in the same manner carried out thus far.

In an ordinary semiconductor laser array in which the elements are arranged maintaining a distance of several hundred microns and the exit divergence angle of laser beams is as broad as 10° to 40°, however, the exit beams from the lasers are spatially superposed upon each other which makes it difficult to provide a photodetector for each of the lasers.

In the laser printer employing a rotary polygonal mirror, i.e., employing an n-facet mirror, the light can be deflected if the laser beam has no size $(720/n)°$. To maintain the printing resolution to be greater than a given value, however, the laser beam must have a finite diameter. To carry out the light scanning under a condition where the laser beam is not eclipsed by the rotary polygonal mirror, therefore, the light should be deflected at an angle $\beta$ smaller than $(720/n)°$. The scanning time that corresponds to $\beta$ is called printing time, and $(720/n)° - \beta$ is called blanking time (non-printing time). The printing time corresponds to the time 60 of FIG. 3 and the blanking time corresponds to the time 50 of FIG. 3. Further, the light outputs from the lasers are detected in a time-sharing manner within the time 50 and the control operation is carried out such that the light outputs become constant within the printing time 60. Thus, outputs of all laser beams can be stabilized using a single photodetector.

The semiconductor laser array device used in this embodiment is the one described earlier in conjunction with FIGS. 1, 3 and 4.

In FIG. 5, reference numerals $106_1, \ldots, 106_n$ denote scanning spots, 201 denotes a computer, and reference numeral 202 denotes a control circuit that includes the amplifier 3, signal selector switch 4, APC circuits $5_1, \ldots, 5_n$, laser drivers $6_1, \ldots, 6_n$, and CE circuit 11 of FIG. 1.

Figure 6:
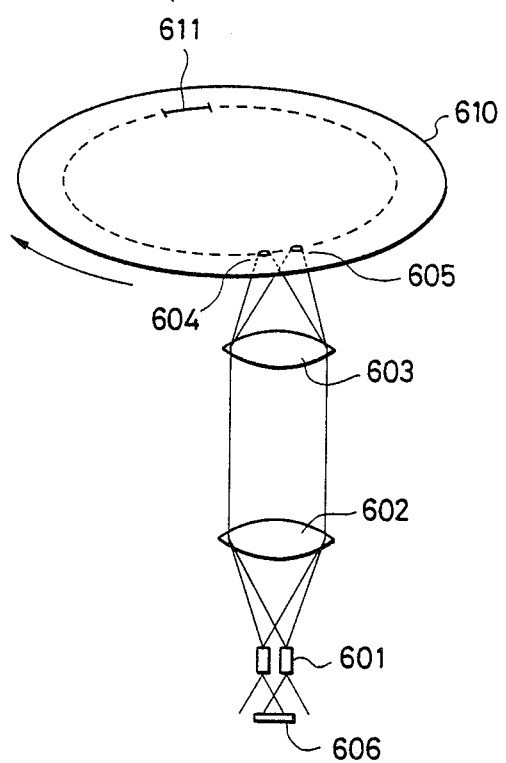
FIG. 6 is a schematic diagram which illustrates an optical disc device employing a semiconductor laser array device of the present invention.

Embodiment 2:

Described below is another embodiment in which the laser array device of the invention is adapted to the optical disk. FIG. 6 illustrates an optical disc system which employs a two-laser array 601 to record the data using one light beam and to retrieve the data using another light beam. A reading light spot 604 and a writing light spot 605 are arranged on the same track adjacent to each other. This enables the writing condition to be checked nearly simultaneously with the writing. When there was only one laser, the data was written by turning the disk once and decreasing the laser beam to a level of the reproduced light power in another turn of the disk, to check the writing condition. By using the two-laser array 601 of the present invention, therefore, the writing and checking are executed simultaneously to increase the effective recording speed.

Though FIG. 6 shows neither the optical system for data detection, misfocusing detection or mistracking detection nor the magnetic coils for the magneto-optical disk, it need not be pointed out that they are necessary for the present invention. The reading light beam is used not only for detecting the data but also for detecting the misfocusing and mistracking.

In order to independently control the light outputs of the two lasers using one monitoring photodetector 606, the two lasers should be independently turned on and off to detect the samples within limited periods of time in which the data is not to be written. For example, the time in which the light spot is running on an alternate sector that exists at one place in each turn of the track of the code data writing optical disk for a computer can be used, or the time in which the light spot is running on an alternate track that exists every after several tracks, can be used, or a period of vertical synchronization retrace line that exists at one place in each turn of the track of an optical video disk, can be used as a non-writing region 611 of the monitoring period of laser beam. FIG. 7 illustrates a relationship between the change of laser light intensity with the lapse of time and the monitor output. The monitoring period consists of a small limited period of time in the time of one track. The read laser light is turned on and the write laser light is turned off in the former half of the monitoring period, and the read laser light is turned off and the write laser light is turned on in the latter half of the monitoring period. The output sampled from the output of the monitoring photodetector for only the former half of the monitoring period is used as a monitor output of read laser power, and the output sampled for only the latter half period is used as a monitor output of write laser power. The monitor outputs are fed back to the laser drive current control circuit to automatically control the laser light output.

Even when the read laser light is not turned off during the monitoring period, i.e., even when the read laser light is maintained turned on during the whole period of time, the light output of the two lasers can be controlled by one photodetector. In this case, the read laser light intensity and the monitor output of write laser light become as indicated by dotted lines in FIG. 7. The monitor output of write laser light that is detected is the sum of write laser light and read laser light. The read laser light has been automatically controlled. Therefore, if the sum of rite laser light and read laser light is detected and is fed back to the light output control circuit (APC circuit shown in FIG. 1 which is not shown in FIG. 6), the write laser light can be automatically controlled. In this case, since the read laser light is turned on at all times, the focus error signal and the track error signal are not interrupted in time. Therefore, the focusing control and the tracking control can be stably carried out. To turn the read laser beam off, it is necessary to hold the focus error signal and the track error signal.

The foregoing description has dealt with the case where the misfocusing and mistracking were continuously detected in time. When the misfocusing and mistracking are to be detected only at sampling points that are discrete in time, the read laser light will be turned on and off during the periods of time other than the sampling points without at all affecting the focusing control and the tracking control. During the monitoring period, therefore, the read laser light may be kept either turned off or turned on to stably carry out the focusing control and the tracking control. During the monitoring period, the write laser light must be turned on to monitor the write laser light. In the case of the magneto-optical disk, the write film condition does not change at all even when the write laser light is turned on provided the external magnetic field is turned off as shown in FIG. 7. Therefore, even when the light is monitored during the alternate sector, the alternate sector is maintained under the condition where no data is written. This also holds true for the case of DC magnetic field optical modulation recording and for the case of DC light irradiation magnetic modulation recording. FIG. 7 illustrates the former case. In the case of the write-once optical disk or phase change type erasable optical disk, however, if the write laser light is turned on to monitor it, the recording is effected by the write laser light. Therefore, it is not allowed to use the alternate sector as a monitoring period. A small region for monitoring must be provided at a portion of the track.

In FIG. 6, reference numeral 602 denotes a collimator lens, 603 denotes a focusing lens, and 610 denotes an optical disk.

As described above, the present invention makes it possible to detect the light outputs of lasers of a semiconductor laser array in which a plurality of semiconductor lasers are one-dimensionally or two-dimensionally arranged in a time-sharing manner using a single photodetector installed at the back of the laser array, and to easily control the light outputs using a control circuit so that the individual light outputs are maintained constant.

What is claimed is:

1. A semiconductor laser array device comprising:
   a plurality of semiconductor laser light sources arranged proximate to one another in at least one dimension;
   a single photodetector provided near exit ports on one side of said plurality of semiconductor laser light sources for detecting light outputs from said plurality of semiconductor laser light sources;
   means for independently detecting in a time sequence within each of predetermined detection periods of time respective light outputs of all of said plurality of semiconductor light sources which are required to be stabilized utilizing said single photodetector; and
   means responsive to the respective detected light outputs of said plurality of semiconductor light sources for individually controlling the respective semiconductor laser light sources to be stabilized so as to maintain the light outputs thereof at predetermined constant values until the next time of detection.

2. A semiconductor laser array device according to claim 1, wherein said detecting means includes signal selector switch means which, when the number of plurality of semiconductor laser light sources whose outputs are to be stabilized is n, selects the output of said single photodetector n times within said predetermined detection period of time, and amplifier means for amplifying the selected output, said control means including automatic power control circuit means for receiving output signals of a predetermined number of times selected from n output signals of said signal selector switch means so that said selected output signals correspond to said semiconductor laser light sources at a ratio of 1 to 1, said automatic power control circuit means comparing said selected output signals with a predetermined reference value so as to generate error signals indicative of the difference therebetween and for holding the error signals until the next predetermined period of detection, and laser driver means responsive to the error signals for controlling said semiconductor laser light sources so that the error signals are corrected to become zero, said control means further including control electronic circuit means for generating timing signals n times for application to said signal selector switch means and for generating timing signal a total of n times for application to said automatic power control circuit means of the number n and to said laser driver means of the number n, said timing signals of the total number of n times corresponding to said semiconductor light sources at a ratio of 1 to 1, and being generated in synchronism with each of the signals selected from said n times of timing signals for said signal selector switch means.

3. A semiconductor laser array device according to claim 1, wherein said predetermined detection period of time is a period other than a time period in which data signals are supplied to said plurality o semiconductor light sources.

4. A semiconductor laser array device according to claim 1, wherein said plurality of semiconductor laser light sources are arranged proximate to one another at a spacing no greater than 1 mm in the at least one dimension.

5. A semiconductor laser array device according to claim 1, wherein said plurality of semiconductor laser light sources are arranged at a spacing no greater than 1 mm in two dimensions.

6. A semiconductor laser array device comprising:
   a plurality of semiconductor lasers arranged at positions maintaining a distance no greater than 1 mm relative to each other;
   means for turning on all of said plurality of semiconductor lasers having outputs which are required to be stabilized at a predetermined value during each of predetermined detection periods of time so that unstabilized outputs of the respective lasers are not superposed upon each other in a time sequence during said predetermined detection period;
   a single photodetector provided near exit ports on one side of s id semiconductor lasers for detecting light outputs from said semiconductor lasers;
   means for obtaining error signals for each of said lasers whose outputs are to be stabilized at the predetermined value by comparing signals from said single photodetector indicative thereof with the predetermined value and for generating error signals indicative of the difference therebetween;
   means for holding the error signals for the respective semiconductor lasers until the next predetermined detection time period; and
   feedback means for feeding back the error signals to the respective semiconductor lasers whose outputs are to be stabilized at the predetermined value for stabilizing the light outputs of said semiconductor lasers during a period of time other than the predetermined detection period of time.

7. A semiconductor laser array device according to claim 6, wherein means are provided for continuously turning on said semiconductor lasers whose outputs have been predetermined stabilized during said period of time other than said detection period of time.

8. A semiconductor laser array device according to claim wherein said means for turning on said semiconductor lasers during said predetermined detection period of time turns on respective semiconductor lasers in time sequence.

* * * * *